United States Patent
Lin et al.

(10) Patent No.: US 11,537,504 B2
(45) Date of Patent: Dec. 27, 2022

(54) REALIZATION OF FUNCTIONAL VERIFICATION DEBUG STATION VIA CROSS-PLATFORM RECORD-MAPPING-REPLAY TECHNOLOGY

(71) Applicant: XEPIC CORPORATION LIMITED, Nanjing (CN)

(72) Inventors: Tsair-Chin Lin, Saratoga, CA (US); Jingbo Gao, San Jose, CA (US)

(73) Assignee: XEPIC CORPORATION LIMITED, Nanjing (CN)

( * ) Notice: Subject to any disclaimer, the term of this patent is extended or adjusted under 35 U.S.C. 154(b) by 370 days.

(21) Appl. No.: 16/752,167

(22) Filed: Jan. 24, 2020

(65) Prior Publication Data
US 2020/0242006 A1 Jul. 30, 2020

Related U.S. Application Data

(60) Provisional application No. 62/797,869, filed on Jan. 28, 2019.

(51) Int. Cl.
*G06F 9/445* (2018.01)
*G06F 11/36* (2006.01)
*G06F 1/08* (2006.01)

(52) U.S. Cl.
CPC ............ *G06F 11/3652* (2013.01); *G06F 1/08* (2013.01); *G06F 11/3624* (2013.01);
(Continued)

(58) Field of Classification Search
CPC .................................................. G06F 11/3652
(Continued)

(56) References Cited

U.S. PATENT DOCUMENTS 7,080,331 B2 * 7/2006 Wozniak ............... G06F 11/261
714/E11.167
7,480,610 B2 * 1/2009 Scott ..................... G06F 30/331
703/23

(Continued)

FOREIGN PATENT DOCUMENTS

WO WO-2019167081 A1 * 9/2019

OTHER PUBLICATIONS

Jeffrey Goeders et al. "Effective FPGA Debug for High-Level Synthesis Generated Circuits"; Department of Electrical and Computer Engineering University of British Columbia Vancouver, Canada—2014 24th International Conference on Field Programmable Logic and Applications (FPL).*

*Primary Examiner* — Francisco J Aponte
(74) *Attorney, Agent, or Firm* — Anova Law Group, PLLC

(57) ABSTRACT

An efficient and cost-effective method for usage of emulation machine is disclosed, in which a new concept and use model called debug station is described. The debug station methodology lets people run emulation using a machine from one vendor, and debug designs using a machine from another vendor, so long as these machines meet certain criteria. The methodology and its associated hardware hence are called a 'platform neutral debug station.' The debug station methodology breaks loose usage of emulation machines, where people can choose the best machine for running a design, and the best machine for debugging, and they do not need to be the same. Unlike the past, where people needed to run emulation and debug a design using same emulator from beginning to the end, the mix-and-match method described herein allows users to use emulators in the most efficient way, and often most cost effective too.

25 Claims, 6 Drawing Sheets

(52) U.S. Cl.
CPC ...... *G06F 11/3688* (2013.01); *G06F 11/3692* (2013.01); *G06F 2201/84* (2013.01)

(58) Field of Classification Search
USPC .......................................................... 703/23
See application file for complete search history.

(56) References Cited

U.S. PATENT DOCUMENTS

| | | | | |
|---|---|---|---|---|
| 8,140,925 B2* | 3/2012 | Bellofatto | ........... | G06F 11/2236 |
| | | | | 713/400 |
| 8,843,861 B2* | 9/2014 | Selvidge | ................. | G06F 30/30 |
| | | | | 716/102 |
| 9,183,329 B2* | 11/2015 | Yeh | .......................... | G06F 30/33 |
| 9,217,774 B2* | 12/2015 | Foisy | ................. | G06F 30/3312 |
| 9,418,187 B2* | 8/2016 | Foisy | ................. | G06F 30/3312 |
| 9,684,743 B2* | 6/2017 | Larzul | ..................... | G06F 30/34 |
| 9,703,579 B2* | 7/2017 | Suresh | ................ | G06F 11/3652 |
| 10,198,538 B1* | 2/2019 | Quayle | ................. | G06F 30/331 |
| 10,282,501 B1* | 5/2019 | Ramabadran | ........... | G06F 30/34 |
| 10,664,637 B2* | 5/2020 | Krishnamurthy | ..... | G06F 30/331 |
| 10,691,580 B1* | 6/2020 | Kasat | ...................... | G06F 9/455 |
| 10,698,792 B2* | 6/2020 | Nelson | ................ | G06F 11/3664 |
| 10,698,805 B1* | 6/2020 | Ovadia | ............... | G06F 11/3688 |
| 10,846,455 B2* | 11/2020 | Ghosh | ..................... | G06F 30/20 |
| 11,003,819 B1* | 5/2021 | Wakefield | ............. | G06F 30/331 |
| 11,138,019 B1* | 10/2021 | Sastry | ..................... | G06F 8/443 |
| 2014/0123090 A1* | 5/2014 | Alfieri | ................... | G06F 30/367 |
| | | | | 716/111 |
| 2017/0185710 A1* | 6/2017 | Suresh | ................. | G06F 30/331 |
| 2019/0004921 A1* | 1/2019 | Fahim | .................. | G06F 11/349 |
| 2019/0347125 A1* | 11/2019 | Sankaran | ............ | G06F 9/30189 |
| 2020/0327027 A1* | 10/2020 | Mittal | ................... | G06F 11/263 |

* cited by examiner

REALIZATION OF FUNCTIONAL VERIFICATION DEBUG STATION VIA CROSS-PLATFORM RECORD-MAPPING-REPLAY TECHNOLOGY

CROSS-REFERENCE TO RELATED APPLICATION(S)

This application claims the benefit of U.S. Provisional Patent Application Ser. No. 62/797,869, filed Jan. 28, 2019, and titled "REALIZATION OF FUNCTIONAL VERIFICATION DEBUG STATION VIA CROSS-PLATFORM RECORD-MAPPING-REPLAY TECHNOLOGY," which is hereby incorporated by reference in its entirety for all purposes.

FIELD OF THE INVENTION

The present invention relates to the field of computer technology. More specifically, the present invention relates hardware-based emulators for functional and system level verification.

BACKGROUND OF THE INVENTION

Emulation has become an important tool for Integrated Circuits (IC) design. As design size grows to hundreds of millions of gates or even billions of gates, it is nearly impossible to do design verification without the help of emulation platform. Many IC design companies work on multiple IC projects at the same time. And for each IC project, multiple designers verify and debug their design at the same time. When a designer works on a design, they usually work in two phases. The first phase is to verify whether their design works correctly in their testing environment. The second phase is to debug the design once a problem is found during the first phase. In many cases, a designer may spend more time to debug their design in addition to verify their design. Therefore, they use a large number of emulation systems to satisfy their verification demand.

Since designers share the emulation resources during verification, one person's verification activity often affects verification progress of another person, and they often end up fighting for the same emulation resource. Verification efficiency is thus reduced. At the same time, the company often spends more money to purchase more emulators, and this will affect operation cost of a company. Verification time and verification efficiency, as well as monetary overhead for emulation resources, often are some of the most critical issues for an IC design house. The situation is getting worse for these companies, as designs are getting bigger, and time to market of an IC becoming shorter. Most companies are looking for relief of the situation.

SUMMARY OF THE INVENTION

It is a common practice for modern IC and system design engineers to use emulators to verify their designs. For large designs, (e.g., over half billion or multi-billion gate design), using a hardware-based emulator is important as software-based simulators often cannot handle such a big design. Emulators usually are used in two scenarios: one is in a regression or normal run, where people just want to use the machine to see whether their design is working or not. Another is in a debug phase, where people use the machine to identify the "bugs," or problems, in their design.

Because of its importance, there are many vendors who produce emulators, and each of them has its own pros-and-cons. For example, an emulator from one vendor might run faster and is cheaper, yet is not powerful enough to support effective debugging (of an IC system). Sometimes people are forced to buy emulators from multiple vendors but efficiency of using them is not great. Even in the case of using emulators from a single vendor, designers are often fighting for the machine at regression test phase and at debugging phase, and again, add complexity to machine usage management and efficiency.

Described herein are embodiments to let people choose the emulator of their preference during normal run and during debug phases. The technology disclosed will make it more efficient to use an emulator with less conflict between the two phases, and for each phase to run faster. Moreover, people are able to use a machine one vendor during a normal run, and use that run information to debug their design in another emulator which is from a different vendor. This 'cross-platform' technology is very powerful, as it lets people to mix-and-match all emulators they have, to improve machine utilization and verification efficiency. The reason this cross-platform methodology can work is based on the innovative 'record-mapping-replay' technology. The 'cross-platform' concept and the 'record-mapping-replay' technology is the first in industry. The impact to the industry will be dramatic.

An efficient and cost-effective method for usage of an emulation machine is disclosed, in which a new concept and use model called debug station is described and its application is explained. The debug station methodology enables people to run emulation using a machine from one vendor, and debug designs using a machine from another vendor, so long as these machines meet certain criteria. The methodology and its associated hardware hence are called 'platform neutral debug station.' The debug station methodology breaks loose usage of emulation machines, where people can choose the best machine for miming a design, and the best machine for debugging, and they do not need to be the same. Unlike the past where people needed to run emulation and debug a design using same emulator from beginning to the end, the mix-and-match method described herein allows users to use emulators in the most efficient way, and often most cost effective too.

The debug station usage flow also allows a user to debug part of the design. The user is able to run their whole design on a larger emulator. The user is able to save the information for part of the whole design, and then use a smaller emulator to debug the partial design. Users are able to save money by using a small emulator.

Implementation of the debug station is based on a record/RTL state remapping/playback sequence, and by nature it is more effective to apply to debug of a certain design module out of a whole design, although it can apply to debug of whole design too. The remapping mechanism allows a design module to be re-run and generate a waveform in a machine from different vendor, regardless of how a design module is mapped to the specific machine. In other words, during debugging, one can choose a machine from a pool of emulators, where each machine can have a different way to run the design, but it does not matter. For instance, all of these machines are in the "cloud," and through the remapping technique described herein, debugging of a design is able to be conducted in any machine in the cloud. Cloud-based emulation facilitates verification of a design by a team in a geographically diversified location, a common situation in today's global-based design activity. Using a machine in the cloud often is the most cost effective and most efficient too.

A key of the innovation is a technique called 'input stimuli retiming and RTL state remapping.' When an RTL design is mapped to an emulator, its clocking scheme or even state devices could be transformed so it is suitable for specific architecture of the underneath emulation hardware. To take design information (input stimuli, flip-flop and memory states) from one machine to another, the machine specific transformation is recovered (or 'undone'). The approach is to map design states to the original RTL space, which is machine neutral, and adjust input stimuli timing based on a clocking scheme of the target machine before applying stimuli for emulation. These two steps 'neutralize' impact of emulation hardware architecture and are important for platform neutral debug station operations. With this technique, a tool can take design states and module I/O from running a design in one emulator, map and restore design states to another emulator, and apply retimed input stimuli to another emulator while continuing emulation, and generate a waveform for debugging.

A new methodology and technology for using hardware-based emulators to do functional and system level verification is described herein. There are also impacts to design of hardware-based emulators. Included is a 'cross-platform' technique, which allows users to use one emulator in a testing stage, while using another emulator in a debug stage. The two emulators are able to be of different architecture, and come from totally different vendors, hence it greatly improves machine utilization efficiency, and verification efficiency.

The reason the cross-platform methodology works is due to its underneath technology called 'record-snapping-replay.' The record process records design states along with replay information while emulation is running. The recorded data will go through a mapping process so it can be platform neutral, yet truly represent original design state under previous emulation run. The transformed information will be later used in a replay phase, and since it is platform neutral, it can be used for replay in any emulator—same as the one during the recording phase, or a different one from a different vendor. This record-mapping-replay technique is at the center of the associated techniques and applications.

A new way to record debug information from an emulator is also described. The new method records emulation states in a faster manner, hence will improve debug efficiency and verification time. Also, since recording time when the emulator is running is shorter, the machine also can be released for other people to use earlier, hence improve machine utilization significantly.

In terms of debug support, the technology will make debug efficiency better, and it also provides features that are not in previous emulators. The main reason is, unlike conventional emulators where debug information, mostly waveforms, are generated via software. In some embodiments, the debug station method will generate debug information via hardware execution (e.g., a replay process). Hence, it is much faster and more flexible. With debug station, two new important features are also available, one is memory dump, and another is trigger-based debugging. Memory contents via memory dump will provide users additional valuable information while doing debugging. Trigger-based methodology will let users generate a waveform in a faster manner, as the waveform can be centered around a critical debug condition (e.g., the trigger condition), so it will be very focused and very efficient.

Previously, a System On a Chip (SOC) design tended to be very big and could be easily billions of gates capacity. However, during verification, it is not necessary that a designer needs to validate every part of the SOC. In fact, some IP might be functional and does not need much attention, and a designer can focus on the new IP he/she creates. With this in mind, a partial 'record' and partial 'replay' concept is implemented as some of the embodiments. A designer identifies a portion of design, e.g., IP-TBV, and with the disclosed method, the machine will record only information related to IP-TBV during a normal run, and replay data associated with IP-TBV during the debug and replay phase. Compared to recording a whole SOC and replay SOC, this new method will greatly improve debug efficiency.

Emulators used at the debug stage can have fewer restrictions in their supporting environment, to the degree that a debug station can be treated just like a workstation. Hence, a debug station is perfectly suited for being deposited in the 'cloud', where any design engineer can access it without restriction. Users can even use an emulator from one vendor in normal run, and use an emulator from another vendor during debugging. This cloud-based emulator setup has been very valuable for emulator vendors and users as well, and the cross-platform technology described herein makes it feasible and practical. The approach will benefit both emulator vendors and emulation users.

In one aspect, a system comprises one or more record adaptors configured to record emulation history from one or more emulators, one or more replay adaptors configured to replay the emulation history and a record/replay framework coupled to the one or more record adaptors and the one or more replay adaptors, the record/replay framework configured to enable cross platform record-mapping-replay, wherein the one or more record adaptors, the one or more replay adaptors and the record/replay framework are programmed in one or more devices. The record/replay framework includes a Hardware Description Language (HDL) parser configured to collect information about state elements, input pins and clocks in a design. The HDL parser includes a clock parser configured to collect the information about the clocks. The system further comprises a compiler configured to compile HDL source code. The record/replay framework includes a session handler to save a session to be replayed. The session handler handles a design snapshot, input stimulus and user actions. The record/replay framework includes a record module to perform actions during recording. The record/replay framework includes a replay module to perform actions during replay. The record/replay framework performs a transformation and an inverse transformation to enable the cross platform record-mapping-replay, performing the transformation includes transforming a clocking scheme and transforming state devices.

In another aspect, a system comprises one or more record adaptors configured to record emulation history from one or more emulators, one or more replay adaptors configured to replay the emulation history, a record/replay framework coupled to the one or more record adaptors and the one or more replay adaptors, the record/replay framework configured to enable cross platform record-mapping-replay, wherein the one or more record adaptors, the one or more replay adaptors and the record/replay framework are programmed in one or more devices, wherein the record/replay framework includes: a Hardware Description Language (HDL) parser configured to collect information about state elements, input pins and clocks in a design, a session handler to save a session to be replayed, a record module to perform actions during recording, a replay module to perform actions during replay and a compiler configured to compile HDL source code. The HDL parser includes a clock parser configured to collect the information about the clocks. The session handler handles a design snapshot, input stimulus and user actions.

In another aspect, a method comprises implementing an emulator/debug station in a plurality of network accessible devices including compiling source code to run on an emulator platform including performing a transformation during compilation, performing testing and/or debugging using the emulator/debug station including recording data and replaying the recorded data on a specific emulator by applying an inverse transformation. Performing the transformation includes transforming a clocking scheme and transforming state devices. The method further comprises mapping design information including input stimuli, flip-flop information and memory states to an original register transfer level space and adjust input stimuli timing based on a clocking scheme of a target machine before applying stimuli for emulation. The method further comprises retrieving clock edge shift information from a first platform and identifying which input signal is associated with which clock domain, wherein the clock edge shift information is utilized to adjust an input signal waveform during record-mapping-replay. Implementing the emulator/debug station includes mapping of recorded data to generate platform neutral information. The emulator/debug station is implemented in a remote server. The plurality of network accessible devices comprise at least two different types of machines. Testing is performed on a different device than debugging. The method further comprises saving and transferring state information between the plurality of devices. Performing testing and/or debugging using the emulator/debug station is for a specific module, and when a user is working on the specific module, a procedure passes on the hardware description language source code for the specific module. Performing testing and/or debugging using the emulator/debug station is for a whole design, and when a user is working on the whole design, a procedure passes on all hardware description language source code. The emulator/debug station comprises: one or more record adaptors configured to record emulation history from one or more emulators, one or more replay adaptors configured to replay the emulation history and a record/replay framework coupled to the one or more record adaptors and the one or more replay adaptors, the record/replay framework configured to enable cross platform record-mapping-replay. The emulator/debug station comprises: one or more record adaptors configured to record emulation history from one or more emulators, one or more replay adaptors configured to replay the emulation history, a record/replay framework coupled to the one or more record adaptors and the one or more replay adaptors, the record/replay framework configured to enable cross platform record-mapping-replay, wherein the record/replay framework includes: a Hardware Description Language (HDL) parser configured to collect information about state elements, input pins and clocks in a design, a session handler to save a session to be replayed, a record module to perform actions during recording, a replay module to perform actions during replay and a compiler configured to compile HDL source code.

DETAILED DESCRIPTION OF THE PREFERRED EMBODIMENT

Described herein is a new method to use emulators. An embodiment is to reduce the time of occupying emulators in the first phase, in a way that it will also reduce debug time in the second phase. Hence, the situations that multiple people fight for same emulation resource will be reduced, and verification time for each designer will also decrease. The idea behind this approach is a record-mapping-replay method for emulator usage.

With the record-mapping-replay method, emulators are divided into two buckets, one for a 'normal' run when people use it to run their test, and another is when people use it for debugging. A method is disclosed for users to collect minimum but sufficient data from a normal run to prepare for debugging, and a way to use the collected data in a debugging phase to uncover design bugs.

As part of the disclosed method, the emulator used in a normal run does not need to be the same for the emulator used in debugging. People can use an emulator from vendor A for a normal run, and an emulator from vendor B to do debugging. Previously, the machine used in normal run always needed to be the same for the one used for debugging. This brand new 'cross-platform' emulator usage method will dramatically change the way design teams use emulators, as designers can freely pick a normal run machine of their preference, and the same for the debug machine as long, as it is powerful enough to support their need.

Figure 1:
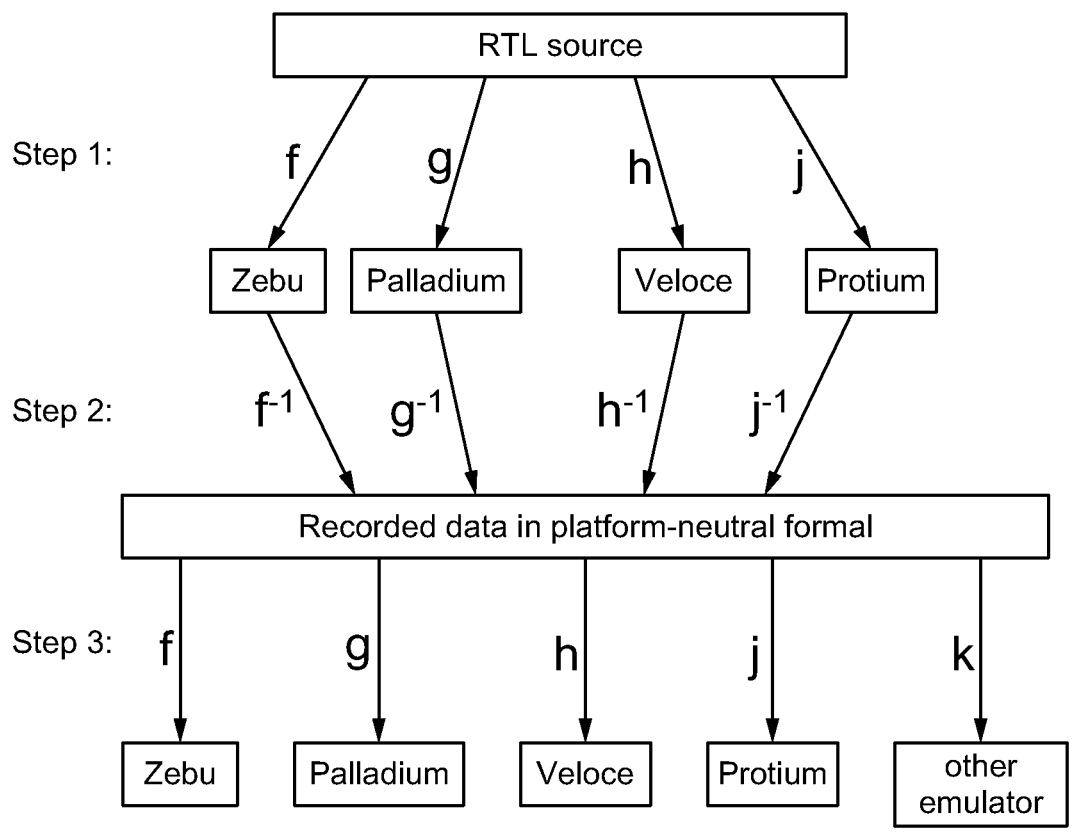
FIG. 1 illustrates a diagram of the concept behind the cross-platform emulation usage according to some embodiments.

FIG. 1 illustrates a diagram of the concept behind the cross-platform emulation usage according to some embodiments. Current available emulators are used from different venders as examples in the following discussion. But the method is not limited to those emulators.

In the first step, RTL source code is compiled so that it can run on a different emulator platform. Some transformations are performed during the compilation, so that the design can be mapped to the specific technique used by a certain emulator hardware. The transformation includes transforming a clocking scheme and transforming state devices. Input stimulus is transformed based on the transformation method of the clocking scheme. A design snap shot is transformed based on the transforming method of state devices. In FIG. 1, functions f, g, h, and j are used to represent the transformation for 4 types of emulators.

In the second step, data is recorded during the normal run. While doing the data recording, inverse-transformation is performed so that the recorded data can be platform neutral. The inverse-transformation will "undo" the transformation done in the first step. In FIG. 1, function $f^{-1}$, $g^{-1}$, $h^{-1}$ and $j^{-1}$ are used to represent the inverse-transformation for 4 types of emulators.

In the third step, the user replays the recorded data on a specific emulator so that they can debug their design. While doing the replay, the "forward transformation" done in step 1 is applied to the recorded data (which is platform neutral), so that it can be replayed on the specific emulator hardware. Therefore, the function f, g, h and j is applied again to the recorded data. The transformation in step 3 could be different from the transformation in step 1, which means the replay can happen cross different platform. For example, Zebu platform is used in step 1, and the transformation function is f. In step 3, the replay is performed on the Palladium platform, and the transformation function is g. In step 3, a new type of emulator is able to be supported which does not exist in step 1, as long as its corresponding transformation function k has been developed.

A capture adaptor and a replay adaptor are described herein. The capture adaptor performs the transformation from platform dependent to platform neutral. The replay adaptor performs the transformation from platform neutral to platform dependent.

A by-product of the cross-platform methodology is cloud-based machine usage. The emulator used in the debug stage is called debug station. The record-mapping-replay algorithm is designed so that the debug station is completely 'hands-free', in a sense that unlike the normal run emulator which sometimes may need users to touch it manually (e.g., push a reset button), the debug station can be used completely from an Internet access. This will allow debugging of a design to be conducted anywhere in the world, as long as the user can access the debug station from the Internet remotely. Since today's technology company often has a design team scattered around the world, verification efficiency and emulator usage efficiency will greatly improve via this cloud-based debug station method.

Use Model with Record-Mapping-Replay Methodology

As described herein, a designer usually works in two phases.

The first phase is to verify the functionality of a design without a need to do debug. The user emulates their design under a certain testing environment to see whether their design works or not. They usually run a lot of tests hoping to catch a design bug. In this phase, what they care about is emulation speed. They also run the emulation under a complete testing environment. For example, they emulate the whole SoC, which is usually very big and might be billions of gates. Therefore, they may use a very large emulator to run the test.

The second phase is to do debugging. They usually do this after they found a design bug from the first phase. They run the emulation multiple times to debug the problem. This is very time consuming.

The user usually reruns the emulation multiple times while doing the debugging. For example, they try different trigger conditions during each run so that they can identify a time point where the root cause of the bug might happen. For a complex testing environment, each time of rerun might take long time before a trigger condition can be met.

It is time consuming to dump a waveform for the identified time window, especially when the user wants the full visibility of the whole design.

Most of the emulator resources are consumed by this debugging phase.

The disclosed debug station is to offload the time-consuming debugging phase to a dedicated emulation system, e.g., debug station. It is based on the idea of doing a record-mapping-replay of the emulation history. A designer will record a history of emulation from the emulator used in normal run. Then they will replay the recorded emulation history on a debug station during the debugging phase. Via this approach, they can do the time-consuming debug process on the debug station. This will free up the emulator to run other tests.

Doing Record on Emulator for a Normal Run

A user will run their tests on the emulator. When they find a bug during emulation, they will do following steps:

Rerun the emulation to reproduce the bug, and identify a time window in t which they want to debug the problem.

Rerun the emulation again to do a record of the specify time window.

A lot of data needs to be saved to files while doing the record. Therefore, the process of doing the record may take some time, which is why it is suggested for the user to record a specific time window during rerun.

A user may also do the record for the whole duration of running their test. They should be aware of the fact that it may take more time to run with recording. A user may do this for some reason. For example, some bugs cannot be easily reproduced. Therefore they cannot rerun the emulation to reproduce and debug the bug. What they can do is to run with recording all the way. When a bug is hit, they can do the debugging based on the recorded emulation history.

In many cases, a user verifies a small module of the design in the complete testing environment, e.g., the whole SoC. This is a very common usage model because it may be impossible to catch a debug bug by only running emulation on the small module. In this usage module, the designer's goal is to verify and debug a small module, but they will use a big emulator to run the whole SoC.

The debug station provides a capability of recording emulation history for a specified module. Therefore, when a designer debugs their module during replay, the debug station only needs to replay the small module. This means that the debug station does not need to be able to handle large design.

Doing Replay on Debug Station

After an emulation history has been recorded, a user replays the emulation history on the debug station. They will do following steps.

Compile the design for the debug station. The compilation process may take time. A user can do the compilation in parallel with the compilation of the original design on the expensive emulator.

When the user wants to do record-mapping-replay for the whole design, they only do the compilation for debug station one time for the whole design.

When the user wants to do record-mapping-replay for certain modules of the whole design, they do multiple compilations for debug station. Each compilation is fir one module. While running the emulation for normal run, they have the option of selecting different module to record.

Debug their design on debug station by doing replay on the recorded emulation history. The debug station provides multiple features that can help user to do the debugging.

Stop the replay at certain clock cycles so that user can check the status of their design. This could be achieved by two ways: run a certain number of clock cycles; set a break point so that replay can stop when a certain condition is satisfied.

After replay is stopped at a certain clock cycle, the user can check the design status by checking design signal values at current cycle. The debug station will allow the user to check all signals in the design, and check memory content.

The user can also dump waveform for a specified time window. For example:

Dump waveform for 1000 ns to 2000 ns.
Dump waveform for 3000 ns around the trigger point.

In addition to replaying the emulation history, the user can also do what-if analysis by sticking some design signal to a certain value or by loading some design memory with a different set of data. By doing this, the replay will not be consistent with the recorded emulation history. But this is a very useful technique when the user is trying their idea to fix the bug.

Why Debug Station Could Be Less Expensive

Cross platform record-mapping-replay and partial replay are the main reason to reduce the cost. Following are a few details why less expensive emulators are able to be built and used as a debug station.

The expensive emulator needs to run faster. The user runs many tests on it therefore the emulation speed is important. However, when the user debugs their design during replay, the emulation speed is not as important. The debug station could be built cheaper and slower.

A very important usage model is to record-mapping-replay partial design. For example, the whole SoC is multiple billion gates and runs on a very huge and expensive emulator. But many designers only debug a small module which is less than 100 million gates. Therefore, the debug station could be much smaller and cheaper.

Some expensive emulators, such as Palladium, have the ability to emulate multiple designs. For example, a customer could have a big Palladium emulator with 1152 domains. Domain is a basic unit of Palladium. Each domain can emulate 4 million gates. A user has a 4 billion gate design which runs with 1152 domains. But they only want debug small modules which have 64 million gates (16 domains). Therefore, the big Palladium emulator can be shared by 72 designs to do the debug in parallel. This can greatly reduce the cost.

Why Debug Station can Improve Debug Efficiency

Cross platform record-mapping-replay and partial replay are the main reason to improve debug efficiency. Following are a few details why it could be achieved.

Different emulators have different capabilities for debugging. Some are strong and some are weak. With cross platform record-mapping-replay, a user can record on one type of emulator and replay on an emulator that has strong debugging capability, which can allow user to debug more efficiently. For example, the Palladium emulator has very strong debug capabilities. The user can define a trigger condition on any design signal. And the user can define a trigger condition with Verilog and VHDL.

Some designs are very huge, which have too much overhead on emulation and debugging. For example, some emulators may use more than one hour to download the design into the emulator. With the partial replay capability, when the user debugs, they only replay a small module of the design, which has very little overhead.

With the debug station, it is very easy and efficient for a user to replay the emulation history. With this capability, a user can replay many times. Each time they could use a trigger condition to identify a point of interest, which happens to a certain set of design signals at a certain cycle. After a user identified a point of interest, they can quickly dump a waveform for a small time window and a small set of design signals. If during their investigation, the user wants a waveform for a longer time window and more signals, they can easily replay again and dump a new set of design signals on a new time window. On the contrary, with a conventional debugging method, the user wants to dump a waveform for a very large time window and a large number of signals. This may take much longer time than debug station.

With debug station, the user can dump a memory snapshot during replay. This is not available on conventional waveform based debugging methods.

Theory of Operation for Record-Mapping-Replay

This section describes the theory of operation for record-mapping-replay from a high level. More details will be described in next section.

What is Recorded

Two types of data are recorded from the expensive emulator.

First, design snapshots are recorded. Design snapshots include the value of all state elements, which include flip-flops, latches and memories. When recording is started, an initial design snapshot is saved. While a design is running, more snapshots will be recorded at a certain interval. The reason to record multiple snapshots is to make replay faster. The design snapshot could be for the whole design or for a specified module of the design, depending on whether the user wants to record for the whole design or for a specified module.

Second, the input pins of a specified module are recorded cycle by cycle. When a user wants to record the whole design, the input pins are the top level input of the design. When a user wants to record a certain module, the input pins are for the specified module. Since the input pins have cycle by cycle data, it is basically equivalent to a waveform for those pins. The cycle by cycle data is not necessarily recorded on every cycle. For example, if in a specific cycle there is no value change on the input pins, then that cycle is not recorded.

How to do Replay

When doing replay on the debug station, the initial snapshot will be restored to debug station. Then, the cycle by cycle data for input pins is applied to the debug station as the input stimulus. With the same initial design snapshot and the same stimulus data on the input pins, the recorded emulation history is replayed cycle by cycle.

Since multiple snapshots are saved during the record, the replay does not need to start from the beginning of the recorded time window. For example, a user recorded a time window from 0 s to 100 s and 10 design snapshots are recorded at an interval of 10 s. On the debug station, the user may want to replay from 55 s to 65 s. The replay will first restore a design snapshot at 50 s. Then it will apply input stimulus from 50 s to 55 s, so that it replays to the start point of the time window requested by the user. Then it will continue to apply an input stimulus from 55 s to 65 s. This way, it will be much faster than replaying from 0 s.

Doing Record-Mapping-Replay to Create Platform-Neutral RTL Timed Database

The idea of doing record-replay is not new. Many existing emulation systems have implemented the idea, for example infiniTrace on the Palladium emulation system. However, the idea of doing record-replay across different emulation systems has not been implemented by any emulation system. This section describes the techniques that make cross platform record-mapping-replay possible.

There Two Assumptions that Guarantee Record-Mapping-Replay Could Work on a Different Emulator.

The first assumption is that emulator will honor the behavior of the HDL source code. When a certain emulator platform compiles the design, it will translate the HDL source code into the specific image that can be run on the emulator. However, it will guarantee that the translation will honor the behavior described by the HDL. it is taken for granted that this assumption is satisfied by all emulators.

The second assumption is that all state elements and input pins in the HDL source code are mapped to corresponding objects in the compiled emulation image. This assumption implies that values for state elements and inputs pins from one emulator can be recorded and replayed on a different emulator. This assumption might not be true. For example, some emulator might do optimization and some state elements might be optimized away. However, it can be assumed that there is something that can be done on a certain emulator so that all state elements will be kept.

Cross Platform Record-Mapping-Replay Architecture

This section defines an architecture that can achieve cross platform record-mapping-replay. This architecture includes 3 major components.

Record-mapping-replay framework. This is a set of procedures that are common for record-mapping-replay operations regardless of what emulator platform is involved. The framework will work with adaptors, which carry out specific operations on specific emulator platform. The interface between the framework and adaptor is well defined.

Record adaptor. This is a set of platform dependent procedures that are used during record.

Replay adaptor. This is set of platform dependent procedures that are used during replay.

Figure 2:
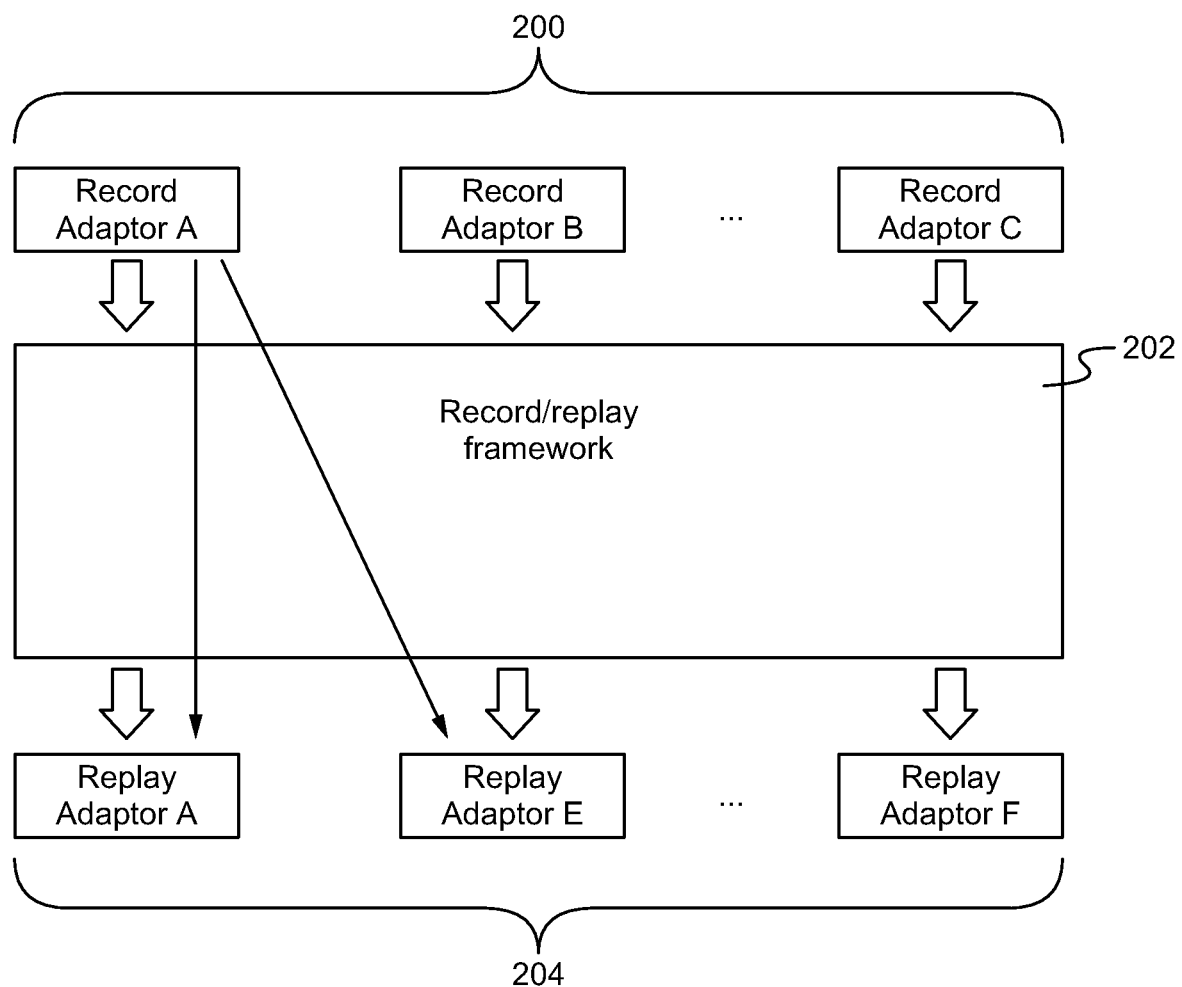
FIG. 2 illustrates a diagram of the concept of record-mapping-replay framework, the record adaptor and replay adaptor according to some embodiments.

The concepts of record-mapping-replay framework, the record adaptor and replay adaptor are illustrated in FIG. 2. The diagram shows multiple record adaptors 200 and multiple replay adaptors 204, which illustrates the possibility that the record-mapping-replay framework 202 can work with multiple types of adaptors. Each record adaptor and replay adaptor is for one type of emulator. The emulator type for the record adaptor could be same as the replay adaptor or could be different from replay adaptor. A user can record an emulation history from any type of emulators supported by a record adaptor and replay the history on any type of emulator supported by the replay adaptor. For example, there are two long arrows in the diagram. It means that an emulation history was recorded from emulator A. The recorded history can be replayed on either emulator A or emulator E.

Figure 3:
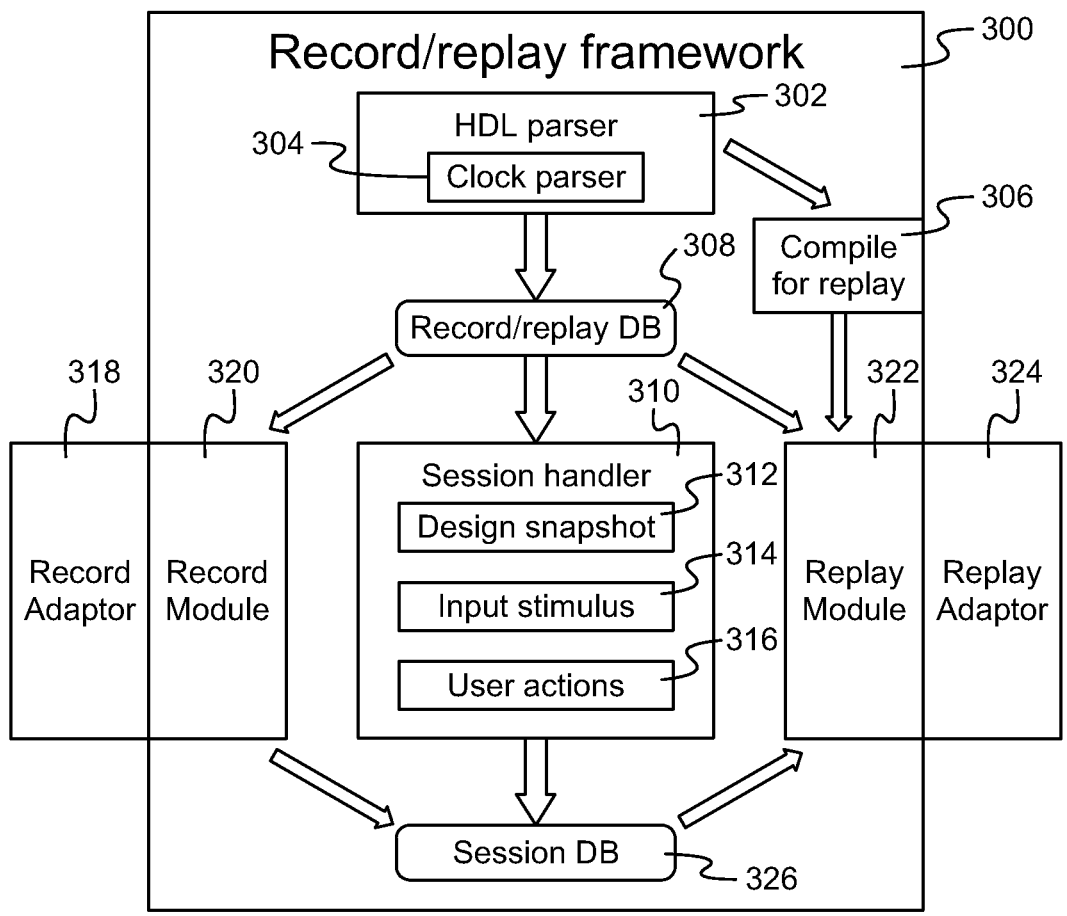
FIG. 3 illustrates a diagram of the actual structure for the record-mapping-replay framework, record adaptor, replay adaptor, together with their relationship according to some embodiments.

The actual structure for the record-mapping-replay framework, record adaptor, replay adaptor, together with their relationship is illustrated by FIG. 3. The major block is the record-mapping-replay framework 300, which performs most operations during cross platform record-mapping-replay. The record adaptor 318 and replay adaptor 324 are smaller blocks, which implies that the amount of development work for the record adaptor 318 and replay adaptor 324 is small compared to the development work for the record-mapping-replay framework 300. Therefore, only a limited amount of work is used to develop a new type of record adaptor and replay adaptor to support a new emulator platform.

The following list gives a brief description about the functional blocks in FIG. 3. More details of each block will be described in later sections.

HDL Parser

The HDL parser 302 parses the HDL source code of the design. It collects information about state elements, input pins, and clocks in the design. They could be for the whole design or a user specified module in the design. That information is saved in the record-mapping-replay database (DB) 308, which is used by other functional blocks such as a record module 320, session handler 310 and replay module 322.

Clock Parser

The clock parser 304 can be considered as part of HDL parser 302. It collects information about clocks. Since many emulator platforms will transform the shape of design clocks for better emulation performance, it is important to know how the transformation is done. During record (or recording), the clock shape is transformed to the native shape which are described by HDL source code. During replay, the native clock shape is transformed to the clock shape used by the replay emulator.

Record-Mapping-Replay DB

The record-mapping-replay DB 308 includes the information collected by the HDL parser 302 and clock parser 304. They are saved in record-mapping-replay DB 308 in a platform neutral format.

Compile for Replay

The compile for replay functional block 306 compiles a design that is used for replay. First, it collects HDL source code to compile. When the user wants to record-mapping-replay a specific module instead of the whole design, the HDL source codes are selected for the specified module. Second, this functional block 306 also inserts instrumental logic for doing the replay. Third, while compiling the design for replay some special instructions are used by/for the compiler so that the emulation history is replayed correctly.

Session Handler

A session is a set of data which is saved during the record. A session is generated by a record module 320 after an emulation history is recorded for a specified time window. A session can be used by replay module to replay the recorded emulation history. The session handler 310 takes care of the operations involved during record-mapping-replay. There are 3 sub-blocks in a session handler 310 which are responsible for handling a design snapshot 312, input stimulus 314 and user actions 316.

Session DB

The session DB 326 is a set of files that contain the data for a session. The difference between record-mapping-replay DB 308 with session DB 326 is that record-mapping-replay DB 308 is static data for a certain design, while session DB 326 is dynamic data for a certain recorded emulation history. A design will include only one record-mapping-replay DB 308. But, it could have multiple session DBs 326, if the user recorded multiple sessions.

Record Module

The record module 320 takes care of the actions that happened during recording, for example, how a design snapshot is saved during recording. The record module 320 works closely with the record adaptor 318. Generally, record adaptor 318 provides a set of procedures that can be used by the record module 320 to perform its operation.

Replay Module

The replay module 322 takes care of the actions that happened during replay, for example, how a design snapshot is restored during replay. The replay module 312 works closely with the replay adaptor 324. Generally, the replay adaptor 324 provides a set of procedures that can be used by the replay module 322 to perform its operation.

The next few sections describe more details about the above functional blocks. However, the sections are organized by describing procedures that are involved during record-mapping-replay. Detailed steps are described for each procedure, which may involve multiple functional blocks. Procedures while compiling design for recording and replay are described, then procedures during recording and procedures during replay are described.

Compiling Design for Recording and Replay

The cross platform record-rapping-replay involves two emulator platforms, e.g., the platform to do the recording and the platform to do the replay. This section describes the procedures that are involved during the compilation of both the recording platform and the replay platform.

Identify HDL Objects

The procedure involves the HDL parser, which parses the Verilog/VHDL source code for the design that the user wants to debug. It could be the whole design or a partial design. This procedure is invoked while compiling a design for recording. It will create a record-mapping-replay DB which includes information that is used by both record-mapping-replay. This procedure is platform neutral; therefore is not related to the record adaptor and replay adaptor.

The HDL parser will collect following information while parsing the HDL source code of the design.

List of all flip-flops.
List of all latches.
List of all memory instances.
List of all input signals.
List of all clock signals, It will get the name of all the above objects and save them in a database that are used by the record-mapping-replay framework. The list of flip-flops, latches and memories are used to record-mapping-replay design snapshots. The list of input signals and list of clock signals are used to record-mapping-replay input stimulus.

The HDL parser generates a record-mapping-replay DB, which includes design information which is used during record-mapping-replay. The record-mapping-replay DB is a set of files. For example, the above 5 lists are saved in 5 different text files. The file format is organized according to a design hierarchy. This makes the file size much smaller compared to simply saving the full path name for each object. Here is an example of the file format:

```
$inst Top
    $inst CPU
        Instr_pointer[31:0]
        regA[63:0]
        regB[63:0]
    $end
    $inst mem_controller
        Addr[43:0]
    $end
$end
```

For the list of memory names, the memory dimensions are saved. A memory could be 2-D, 3-D or even higher dimensions. The size and address range of each dimension are saved. Here is an example for the memory name list:

```
$inst Top
    $inst CPU
        memA[31:0][23:12][0:4]
        memB[63:0][7:0]
    $end
    $inst mem_controller
        memC[43:0][31:0]
    $end
$end
```

Extract Clock Information

The procedure involves a clock parser, which extracts clock related information from both a recording platform and replay platform. To be exact, this procedure is called twice. First, it is called for the recording platform to get clock information for the recording platform. Then, it will be called for the replay platform to get clock information for the replay platform. Since, the clock information is platform dependent, this procedure gets help from the record adaptor and replay adaptor. Both adaptors have a procedure GetClockInfo to get the clock information from the corresponding platform.

Many emulator platforms are so called "cycle accurate verification." They emulate every clock edge but do not care about the time duration from one clock edge to next clock edge. They ensure that the behavior of emulation is accurate on every clock edge.

Figure 4:
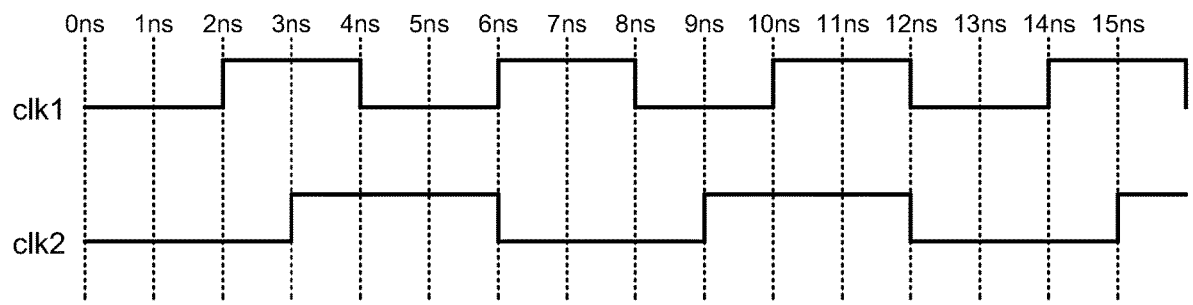
FIG. 4 illustrates an example in which there are 2 clocks with clock duration of 4 ns and 6 ns according to some embodiments.

When a design has multiple clocks, the clock edges are usually not aligned to each other. FIG. 4 shows an example in which there are 2 clocks with clock duration of 4 ns and 6 ns. Clk1 and clk2 have clock edges at 2 ns, 3 ns, 4 ns, 6 ns, 8 ns, 9 ns, 10 ns, 12 ns, . . .

Figure 5:
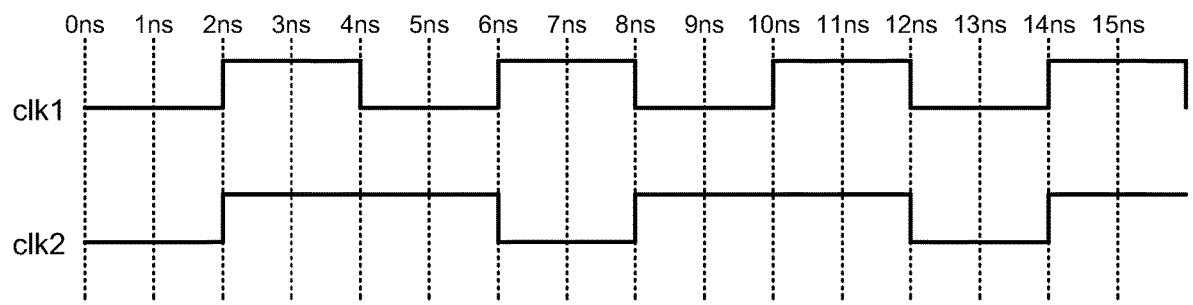
FIG. 5 illustrates an example of the clock waveform when the clock edge of clk2 is shifted forward according to some embodiments.

Some emulators may shift the edge of slower clocks so that they align with the clock edge of the fastest clock. The purpose is to reduce the number of clock edges that are emulated. In FIG. 4, the clock edge of clk2 will be shifted. For example, the clock edge at 3 ns will be either shifted forward to 2 ns or shifted backward to 4 ns. Similarly, the clock edge at 9 ns is either shifted forward to 8 ns or shifted backward to 10 ns. FIG. 5 is the illustration of the clock waveform when the clock edge of clk2 is shifted forward.

Figure 6:
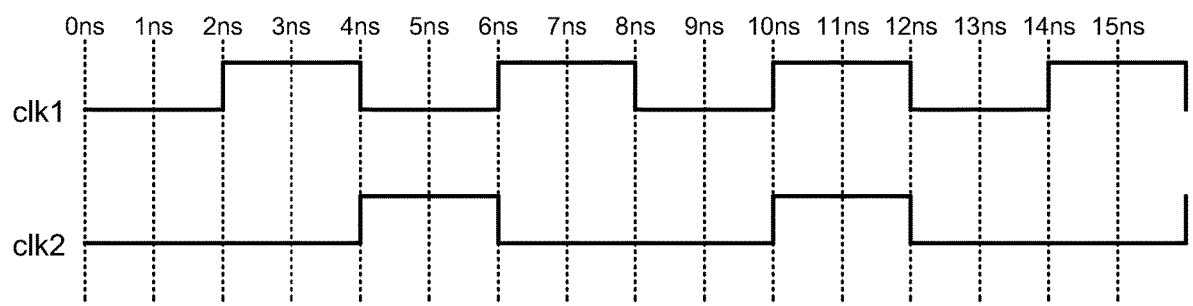
FIG. 6 illustrates an example of the clock waveform when the clock edge of clk2 is shifted backward according to some embodiments.

FIG. 6 is the illustration of the clock waveform when the clock edge of clk2 is shifted backward.

The clock parser performs two tasks.

The first is to retrieve the information about how the clock edge is shifted by a certain emulator platform. The location of all the clock edges of all clock signals is obtained. For example, in the example, the clock edge for the fastest clock, e.g., clk1, is at 0 ns, 2 ns, 4 ns, and so on. The clock edge of clk2 is at 0 ns, 2 ns, 6 ns, 8 ns, and so on, when it is shifted forward. Only the clock edge location from 0 ns to 12 ns is important, because it will repeat the same pattern after that.

This action actually belongs to record adaptor because it is emulator platform dependent. But it is described here for the sake of the completeness of the description.

The second is to identify which input signal is associated with which clock domain. This information is used when recording the cycle by cycle value of the input signals and when replaying the input signals as stimulus. If an input signal is associated with a slower clock, and the clock edge of that clock is shifted, the waveform of the input signal is to be adjusted according to how the clock edge is shifted. This operation is performed both during recording and during replay.

The information saved by the clock parser is used to adjust the input signal waveform during record-mapping-replay. While during record, the record adaptor will adjust the waveform of the input signals so that their toggle time is consistent with the behavior described by HDL source code, e.g., the data is translated from the recording emulator platform to a platform independent format. Similarly while during replay, the replay adaptor will adjust the waveform of the input signals from the platform independent format to the format used by replaying emulator platform.

Map State Elements and Input Signal to Certain Emulator

The procedure is invoked while compiling for recording and compiling for replay. It is platform dependent and therefore involves the record adaptor and replay adaptor. To be specific, it invokes the procedure MapHDLObjects on both the record adaptor and replay adaptor.

The specific emulator has its own specific compilation flow, which maps the HDL design to the internal objects in the emulator. Most emulator platforms have the capability to get/set flip-flop and latch values as a whole. It is much more efficient than doing the get/set for each flip-flop and latch separately. Therefore, one common practice is to save the internal representation for flip-flops and latches as 2 lists. The order for the internal representation is the same as the order for the flip-flop list and latch list generated by the framework. For example, in the Palladium emulator, flip-flops and latches are represented by an integer ID. Therefore, the mapping could be saved as a list of flip-flop ID and a list of latch ID.

Compile HDL Source Code for Replay

Three procedures are involved while compiling HDL source code for replay. Get HDL source code for replay The procedure prepares HDL source code for replay. The procedure is platform neutral.

When the user asks to record-mapping-replay the whole design, this procedure passes on all HDL source code. When the user asks to record-mapping-replay a module instead of the whole design, the procedure picks out the HDL source code for the specified module and passes them to the replay adaptor.

Create Instrumental Logic for Replay

The procedure inserts instrumental logic to pump in stimulus input during replay. The procedure is platform neutral.

Figure 7:
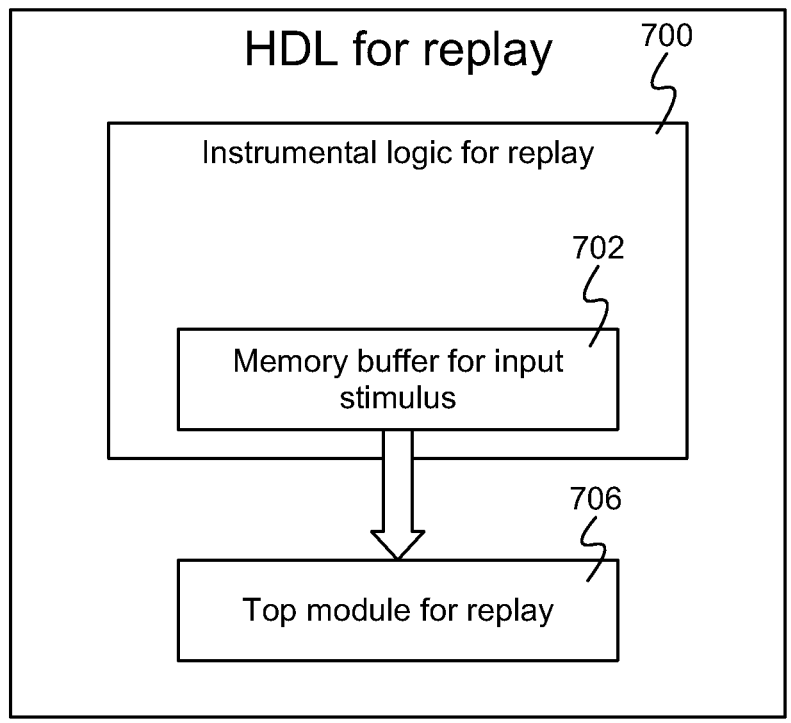
FIG. 7 illustrates the structure for the HDL source code that is used for replay according to some embodiments.

FIG. 7 illustrates the structure for the HDL source code that is used for replay according to some embodiments. There is a memory buffer 702 to hold data for input stimulus. This memory buffer 702 is controlled by instrumental logic 700, which maintains a read address for the memory buffer 702. The read address is increased by 1 on each cycle, so that in each cycle, a new set of input stimulus data will be read out from the memory buffer 702. The data is driving the input pins on the top module for replay 706, which could be the whole design or the module selected by the user during recording. The memory buffer 702 has a certain depth. During replay, an initial set of input stimulus data are loaded into the memory buffer 702. Then, the replay runs for a certain number of cycles until all the data is used. Then, a new set of input stimulus data is loaded and replay runs more cycles.

Make Sure All State Elements can be Restored

The procedure makes special arrangements while compiling a design for replay to make sure that all the state elements can be restored during replay. The procedure uses some special techniques on the replay platform. Therefore, it is platform dependent and depends on the replay adaptor. More specifically, it invokes procedure PreserveStateElements on the replay adaptor.

Most emulator platforms do optimization while compiling a design. The optimization might take away some state element. If a state element is optimized away, then it may be impossible to restore the design snapshot correctly.

There are multiple platform dependent methods to preserve state elements. For example, some platforms have compilation options that preserve state elements. For example, some other platforms may take a list of object names and preserve the specified objects.

Compile the Design to Record-Mapping-Replay Multiple Modules

Users can make multiple compilations for record-mapping-replay, each of which is corresponding to one module. Then, at run time the user can select which module to record. For example, at compile time the user can make 3 compilations, one for the whole design, one for module A and one for module B. Then, at run time the user has the option to select whether to record a whole design, module A or module B.

Recording

This section describes procedures that are involved during recording. Session handler is described first, which is actually used during both recording and replay. But, it is described in the section of recording. Then, what need to be done during recording is described. The record adaptor is also described.

Session Handler

A session means the collection of all data that are acquired from the emulator during a recording process. After a user records an emulation history for a certain period of time, they get a session. Then, they can replay the emulation history based on the recorded session.

This section describes what information is saved in a session and what processes are involved when record-mapping-replay frame handles a session. To be specific, a session includes one or more design snapshots, cycle by cycle data for input stimulus, and user actions. They will be described in following sub-sections. How session data is saved in file is described, which is called a session database.

Every procedure in session handler is platform neutral.

Design Snapshot

Design snapshot is a set of values for state elements in the design, and includes 3 types of information: flip-flops, latches, and memories.

During recording, one or more design snapshots are saved. When saving a design snapshot, the clock of the design is paused so that the state of the design will not change. During replay, one design snapshot is restored depending on the time point that the user asked to start the replay.

Generally, an emulator platform has different ways to save and restore flip-flops, latches and memories. Therefore, the record-mapping-replay platform clusters the design state elements into those 3 types.

Input Stimulus

Since input signals are recorded cycle by cycle, it is similar to recording them as waveform. The data file format for input signals could be a waveform format such as VCD, FSDB or SHM.

User Actions

While a user is running an emulation, the user may want to perform some actions. Those actions are recorded so that the user can re-apply those actions during replay. Following are a list of actions that are recorded.

Force

This action will stick a signal to a fixed value, regardless what value it should have based on HDL behavior.

Release
This action will cancel the effect of force, e.g., a signal will start to behave according to HDL.
Memory Load
This action will load data to a memory through a backdoor.

When saving the user action in a session, a timestamp to identify when the action happened is saved. Therefore, the action is able to be re-applied at the exact time point during replay. This involves the user clock to be paused when the user actions happened. The user clock is paused by a record module automatically.

Session Database

A session database is a set of files that record the data collected from the emulator during recording. The session database includes 3 types of information, e.g., design snapshot, user actions and input stimulus.

The file format for design snapshot is binary data for better read/write performance. The file includes the following information:

1 bit for each flip-flop, assuming the value could be only 0 or 1 and there is no 'x' value.
Therefore, a bit vector could be used to save the value of all flip-flops.
Similarly, another bit vector is used to save the value of all latches.
Each memory object will also be saved as a bit vector. The number of bits will be calculated from the dimension information of the memory. The order of bits is organized from a higher dimension to a lower dimension.
The following factors are considered while designing the file format:
Multiple snapshots are saved into the file.
The number of flip-flops and latches could be large. For example, if a design size is billion gates, then it might have a few hundred million of flip-flops and latches.
The number of bits in each memory varies a lot. A design might have a very small memory and might have a very large memory, for example 8 GB.
The number of memories could be large. For example, some designs may have millions of small memories.

The file format for user actions records the following information for each action.
Timestamp for the action.
HDL objects involved in the action.
Action. For force action, it saves the value that the object is forced to. For memory load action, it saves the binary data that are loaded into the memory. The format of the binary data would be the same format as the memory data saved in a design snapshot.

The file format for input stimulus is actually waveform format. VCD format is able to be used, which is an industry standard format.

Recording Steps

This section describes the detailed steps during recording.

Start Recording

The user first runs the emulation to a certain cycle before they can start the recording. The user specifies a session name. There are multiple actions that happen when the user starts recording.

The user can specify whether to record the whole design or to record a module in the design. The user can specify how frequently to record a design snapshot. Recording more design snapshots will improve the speed to do replay. But it will cost more time during recording and the session DB will occupy more disk space. A session DB is created using the session name. The start time is recorded in the session. There is a call to procedure GetCurrentTime in the record adaptor to get the start time. An initial design snapshot is recorded and saved in the session. There is a call to procedure GetDesignSnapshot in the record adaptor to get a design snapshot from the emulator. Then the design snapshot is saved in the session DB in a platform neural format.

Run Emulation While Recording

After a user starts recording, they can run the emulation while recording data. The emulation will be paused from time to time to upload recorded data from emulator. Then, the emulation will resume. The pause and resume of the emulation happens automatically. The following actions will cause the emulation to pause.

The emulation is paused to upload input stimulus data. As described earlier, input stimulus data are recorded as a waveform. Many emulators have a memory buffer to record waveform data. When the memory buffer is full, the emulation is paused. After the emulation is paused, the following actions will happen.

Call UploadInputStimulus procedure on the record adaptor to upload the input stimulus data.

Call TransformClockShape procedure on the record adaptor to adjust the waveform shape based on the clock information. This transformation will generate a platform neutral waveform for the input stimulus.

The platform neutral waveform is saved in a VCD format in the session DR. The emulation is paused to upload more design snapshots. Saving multiple design snapshots in the session DB will speed up replay when the user wants to start the replay from a specified time point instead of from beginning. The emulation is paused to record user action. Since timestamp is recorded for a user action, the emulation is paused before carrying out the user action. This could be done by intercepting the commands for user actions. This is platform dependent. The InterceptUserAction procedure is called on the record adaptor. Since the user clock should be shifted by an emulator, the timestamp for a user action could also be shifted. Therefore, before saving the user action timestamp, the time is adjusted based on clock information. This is platform dependent and the AdjustTimestamp procedure is called on the record adaptor.

Stop Recording

After the user has recorded enough emulation history, they can stop the recording. The following actions will happen.

Upload remaining input stimulus data from the emulator and save to the session DB. This is the same operation as in running the emulation.

Close the session DB.

Record Adaptor

This section lists all the procedures that a record adaptor provides. Those procedures are mentioned in early sections in this document.

These procedures act as the interface between the record adaptor and record-mapping-replay framework.

GetClockInfo retrieves the information about how clocks are transformed in the emulator.

MapHDLObjects maps the name of state elements and input pins to the internal representation inside the emulator. While recording the record adaptor uses those internal representations to acquire values for them from the emulator.

GetCurrentTime retrieves the current simulation time on the emulator.

GetDesignSnapshot upload the current value for all flip-flops, all latches, and all memory instances.

UploadInputStimulus uploads input stimulus data from the emulator.

InterceptUserAction intercepts user actions for force, release and memory load.

AdjustTimestamp adjust a timestamp according to the method of how clocks are transformed in the emulator.

Replay

This section describes procedures that are involved during replay. What is done during replay and the replay adaptor are described.

Replay Steps

This section describes the detailed steps during replay.

Start Replay

The user asks to start to replay so that they can debug their design during replay. The user specifies the following information at this step.

The user specifies which session DB to replay. Each session DB corresponds to a module that was recorded (or the whole design was recorded) and a time range that was recorded. The user can debug the recorded module during the recorded time range.

The user specifies a start time for the replay. The start time should be within the time window that was recorded in the session DB.

Replay to Start Time

After a user specified a start time for replay, the software will first replay the design to the specified start time. The following steps will happen.

The replay module selects an appropriate design snapshot based on the start time of replay. If multiple design snapshots are saved in the session DB, then the software will select one design snapshot which is before the start time and is closest to the start time. Restore the selected design snapshot to emulator. This is done through procedure RestoreDesignSnapshot in replay adaptor. Apply input pin stimulus data cycle by cycle to do the replay from the snapshot to the start time. The detail of the replay is described next.

An input stimulus is applied to replay emulation history. In this step, the input stimulus are applied to a module cycle by cycle, and the emulation history for the module is replayed cycle by cycle. This process is a loop which involves following operations.

Download input stimulus data to the memory buffer in the replay instrumental logic. The input stimulus data is selected based on a current timestamp and the depth of memory buffer. The download operation is done through a DownloadStimulusData procedure in the replay adaptor. Run forward until time T, in which T is the timestamp of the last cycle in the replay buffer. However, during the run, user actions are taken care of. Therefore, a loop is performed to do the following while there is a user action that happens before T.

Suppose the timestamp for user action is T1, in which T1<T.

Run emulation until T1. This is done through procedure RunTo in replay adaptor.

It is possible that a user defined trigger could happen before T1. In that case, the user will likely stop the replay so that they can do debugging at the trigger point. If this is the case, then the process of replay is stopped.

Otherwise, the user action will be replayed, and the loop will continue. The ApplyUserAction procedure is called in the replay adaptor to replay the user action.

Replay Adaptor

This section lists the procedures that a replay adaptor provides.

These procedures act as the interface between the replay adaptor and the record-mapping-replay framework.

GetClockInfo get the information about how clocks are transformed in the emulator.

MapHDLObjects map a name of state elements and input pins to the internal representation inside the emulator. While doing replay, the replay adaptor uses those internal representation to set values for them into the emulator.

PreserveStateElements preserves all state elements while compiling the design for replay.

RestoreDesignSnapShot sets the value for following objects into emulator all flip-flops, all latches, and all memory instances.

DownloadStimulusData downloads cycle by cycle data for input pins into the stimulus buffer in the emulator. Also, sets up the read address for the stimulus buffer.

RunTo runs the emulation until a specified times amp is met or until trigger happens.

ApplyUserAction applies a user action at the current cycle. The user action could be force, release or memory load.

Record Adaptor and Replay Adaptor for Palladium Emulator

This section uses the Palladium emulator as an example to demonstrate how to implement a record adaptor and a replay adaptor.

The Palladium compiler has the feature of preserving all names in HDL source code. And it has an option to preserve all state elements in the emulator image. Therefore, the name mapping is very simple to do.

The Palladium emulator can group a set of signals as a SYMBOL. Therefore, it can define a SYMBOL for all flip-flops and another symbol for all latches. Then, it can get the value of a SYMBOL very quickly.

The Palladium emulator can upload data for any memory object. However, it has its own bit order when handling multi-dimensional memory. Therefore, the record adaptor needs to transform the bit order based on the requirement of the framework.

Input signals can be recorded as waveform. Palladium has a feature called Dynamic Probes (DYNP) which can quickly generate a waveform for a set of defined signals. Palladium also has a feature called continuous upload, which can dump a continuous waveform for a time window of any size.

Therefore, the steps to do recording in Palladium emulator would include:

Setup DYNP and continuous upload to record input signals

Upload an initial snapshot for state elements

Enter a loop to run N cycles and upload a new snapshot.

How to do Replay on Palladium Emulator

This section uses the Palladium emulator as example to illustrate how to do replay. To be specific, it will describe how to implement the operations in the replay adaptor for Palladium.

Name mapping is the same as the Palladium record adaptor in the previous section. The same as the record adaptor, Palladium emulator can use SYMBOL to set flip-flop and latch values very quickly. The Palladium emulator can download data for any memory object. However, it has its own bit order when handling multi-dimensional memory. Therefore, the replay adaptor transforms the bit order from the framework order to the Palladium order. Stimulus data for input signals is read from a waveform format and downloaded to the memory buffer in the instrumental logic for replay.

Figure 8:
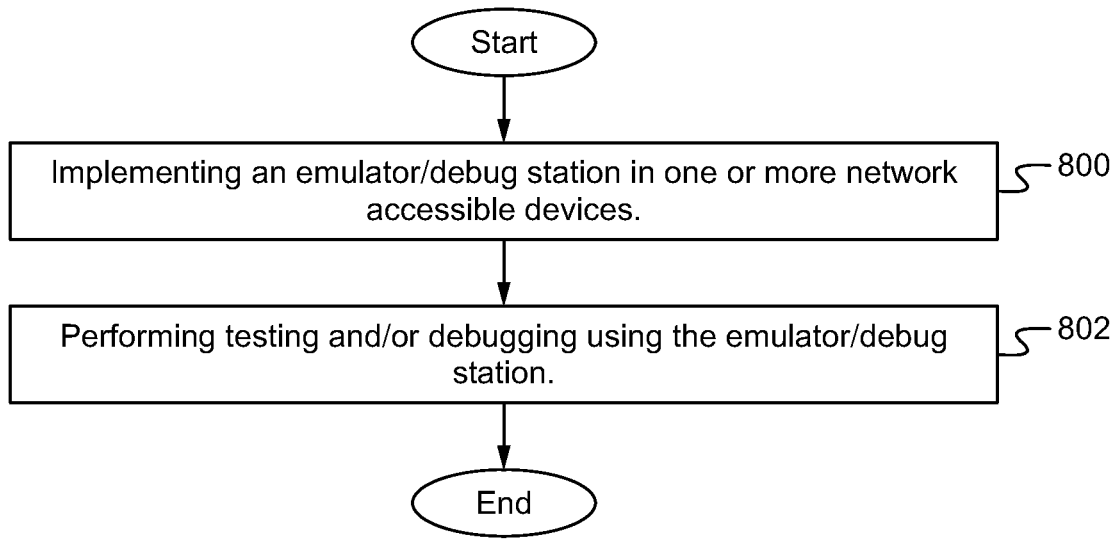
FIG. 8 illustrates a flowchart of a method of cross-platform record-mapping-replay according to some embodiments.

FIG. 8 illustrates a flowchart of a method of cross-platform record-mapping-replay according to some embodiments. In the step 800, an emulator/debug station is implemented in one or more network accessible devices. For example, the emulator/debug station is implemented in "the cloud." By implementing the emulator/debug station in the cloud, many different types of devices are able to access the debug station. Additionally, the emulator/debug station is able to be installed/executed by many different types of devices. The emulator/debug station implements 'record-mapping-replay.' The record process records design states along with replay information while emulation is running. The recorded data will go through a mapping process so it can be platform neutral, yet truly represent the original design state under the previous emulation run. The transformed information will be later used in a replay phase, and since it is platform neutral, it can be used for replay in any emulator—same as the one during the recording phase, or a different one from a different vendor. When an RTL design is mapped to an emulator, its docking scheme or even state devices could be transformed so it is suitable for a specific architecture of the underneath emulation hardware. To take design information (input stimuli, flip-flop and memory states) from one machine to another, the machine specific transformation is recovered (or 'undone'). The approach is to map design states to the original RTL space, which is machine neutral and adjust input stimuli timing based on a clocking scheme of the target machine before applying stimuli for emulation. In the step 802, a user performs testing and/or debugging using the emulator/debug station. As described herein, the testing is able to be implemented on the same or a different machine than the debugging. The emulator/debug station is able to save states and transfer other information between machines, as described herein, such that the process is able to take place across multiple, disparate devices. The emulator/debug station is able to compile/debug a specific module or a whole design. In some embodiments, fewer or additional steps are implemented. In some embodiments, the order of the steps is modified.

Figure 9:
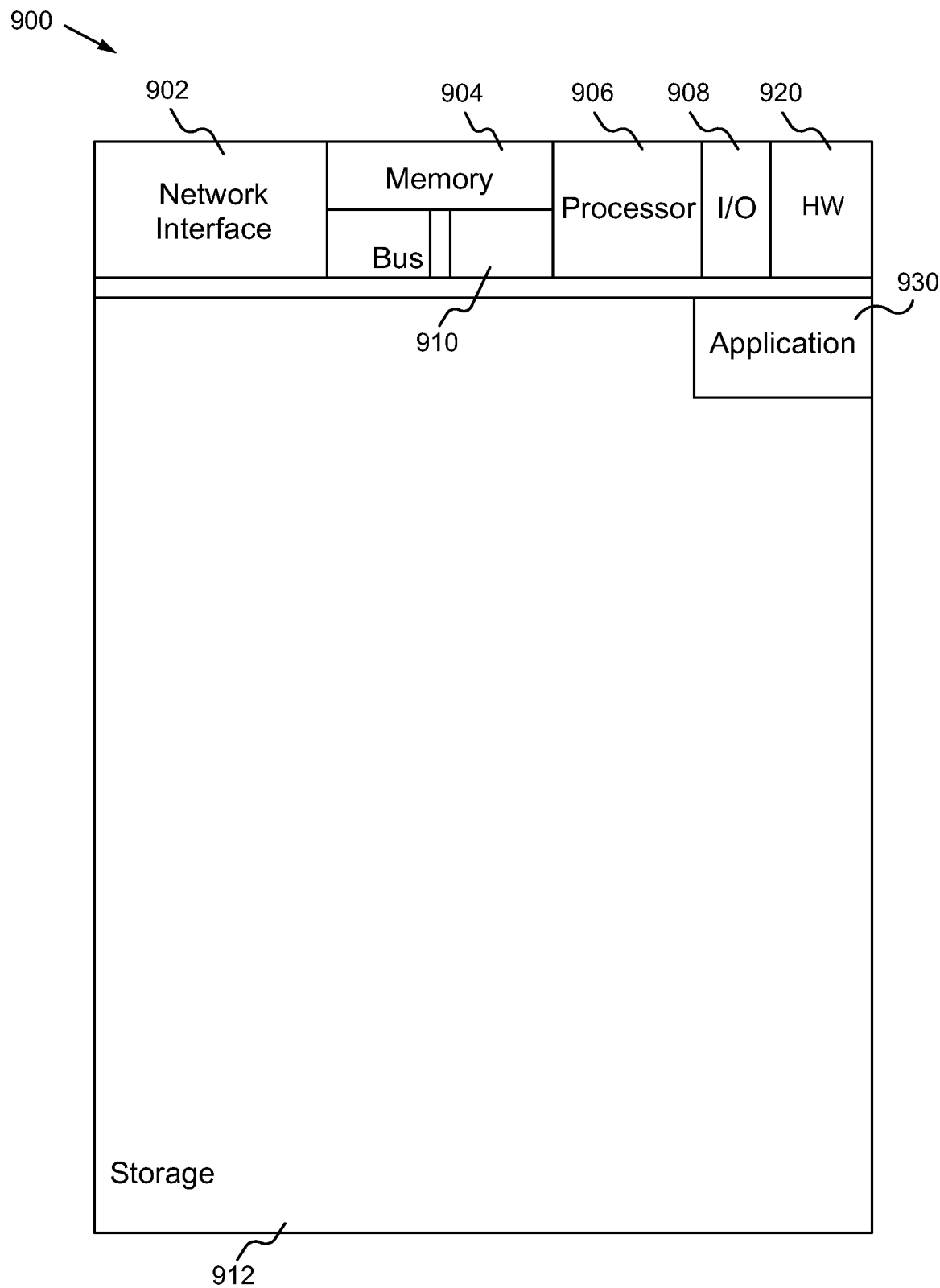
FIG. 9 illustrates a block diagram of an exemplary computing device configured to implement the cross-platform record-mapping-replay system according to some embodiments.

FIG. 9 illustrates a block diagram of an exemplary computing device 900 configured to implement the cross-platform record-mapping-replay system according to some embodiments. The computing device 900 is able to be used to acquire, store, compute, process, communicate and/or display information. In general, a hardware structure suitable for implementing the computing device 900 includes a network interface 902, a memory 904, a processor 906, I/O device(s) 908, a bus 910 and a storage device 912. The choice of processor is not critical as long as a suitable processor with sufficient speed is chosen. The memory 904 is able to be any conventional computer memory known in the art. The storage device 912 is able to include a hard drive, CDROM, CDRW, DVD, DVDRW, flash memory card, solid state drive or any other storage device. The computing device 900 is able to include one or more network interfaces 902. An example of a network interface includes a network card connected to an Ethernet or other type of LAN. The 110 device(s) 908 are able to include one or more of the following: keyboard, mouse, monitor, display, printer, modem, touchscreen, touchpad, speaker/microphone, voice input device, eye detection, infrared detection, hologram detection, button interface, hand-waving, body-motion capture, touchless 3D input, joystick, remote control, camera, and other devices. In some embodiments, the hardware structure includes multiple processors and other hardware to perform parallel processing. Cross-platform record-mapping-replay application(s) 930 used to perform the cross-platform record-mapping-replay method are likely to be stored in the storage device 912 and memory 904 and processed as applications are typically processed. More or fewer components shown in FIG. 9 are able to be included in the computing device 900. In some embodiments, cross-platform record-mapping-replay hardware 920 is included. Although the computing device 900 in FIG. 9 includes applications 930 and hardware 920 for implementing the cross-platform record-mapping-replay method is able to be implemented on a computing device in hardware, firmware, software or any combination thereof. For example, in some embodiments, the cross-platform record-mapping-replay applications 930 are programmed in a memory and executed using a processor. In another example, in some embodiments, the cross-platform record-mapping-replay hardware 920 is programmed hardware logic including gates specifically designed to implement the method.

In some embodiments, the cross-platform record-mapping-replay application(s) 930 include several applications and/or modules. In some embodiments, modules include one or more sub-modules as well. In some embodiments, fewer or additional modules are able to be included. In some embodiments, the applications and/or the modules are located on different devices. Any configuration of where the applications/modules are located is able to be implemented such that the cross-platform record-mapping-replay system is executed.

In some embodiments, a specialized computing device is utilized to implement the cross-platform record-mapping-replay system. In some embodiments, the specialized computing device utilizes a dedicated processor and/or dedicated memory for processing information. In some embodiments, instructions are stored on the specialized computing device to enable the computing device to efficiently analyze information to perform the cross-platform record-mapping-replay method.

Examples of suitable computing devices include, but are not limited to a personal computer, a laptop computer, a computer workstation, a server, a mainframe computer, a handheld computer, a personal digital assistant, a pager, a telephone, a fax machine, a cellular/mobile telephone, a smart appliance, a gaming console, a digital camera, a digital camcorder, a camera phone, a smart phone/device (e.g, a Droid® or an iPhone®), a portable music player (e.g., an iPod®), a tablet (e.g., an iPad®), a video player, an e-reader Kindle™), a DVD writer/player, an HD (e.g., Blu-ray®) or ultra high density writer/player, a television, a copy machine, a scanner, a car stereo, a stereo, a satellite, a DVR (e.g., TiVo®), a smart watch/jewelry, smart devices, a home entertainment system or any other suitable computing device.

To utilize the cross-platform record-mapping-replay system, an emulator/debug station is implemented in a network accessible device. For example, the emulator/debug station is implemented in "the cloud." By implementing the emulator/debug station in the cloud, many different types of devices are able to access the debug station. Additionally, the emulator/debug station is able to be installed/executed by many different types of devices. A user performs testing and/or debugging using the emulator/debug station. As described herein, the testing is able to be implemented on the same or a different machine than the debugging. The emulator/debug station is able to save states and transfer other information between machines, as described herein, such that the process is able to take place across multiple, disparate devices.

In operation, the debug station methodology enables people to run emulation using a machine from one vendor, and debug designs using a machine from another vendor, so long as these machines meet certain criteria. The methodology and its associated hardware hence are called 'platform neutral debug station.' The debug station methodology breaks loose usage of emulation machines, where people can choose the best machine for running a design, and the best machine for debugging, and they do not need to be the same. Unlike the past, where people needed to run emulation and debug a design using the same emulator from beginning to the end, the mix-and-match method described herein allows users to use emulators in the most efficient way, and often the most cost effective way too.

The debug station usage flow also allows a user to debug part of the design. Users can run their whole design on a larger emulator. They can save the information for part of the whole design, and then use a smaller emulator to debug the partial design. Users can save money by using small emulator.

Implementation of a debug station is based on a record/RTL state remapping/playback sequence, and by nature it is more effective to apply debugging of certain a design module out of whole design, although it can apply to debugging of the whole design too. The remapping mechanism allows a design module to be re-run and generate a waveform in a machine from a different vendor, disregarding how a design module is mapped to the specific machine. In other words, during debugging, one can choose a machine from a pool of emulators, where each machine can have a different way to run the design, but it does not matter. For example, all of the machines are in the cloud, through the remapping technique from this innovation, and debugging of a design can be conducted in any machine in the cloud. Cloud-based emulation facilitates verification of a design by a team in a geographically diversified location, a common situation in today's global-based design activity. Using a machine in the cloud often is most cost effective and most efficient too.

A key of the innovation is a technique called 'input stimuli reaming and RTL state remapping.' When an RTL design is mapped to an emulator, its clocking scheme or even state devices could be transformed so it is suitable for specific architecture of the underneath emulation hardware. To take design information (input stimuli, flip-flop and memory states) from one machine to another, the machine specific transformation is recovered (or 'undone'). The approach is to map design states to the original RTL space, which is machine neutral, and adjust input stimuli timing based on a clocking scheme of the target machine before applying stimuli for emulation. These two steps 'neutralize' the impact of emulation hardware architecture and are the important for platform neutral debug station operations. With this technique, a tool can take design states and module I/O from a running design in one emulator, map and restore design states to another emulator, and apply returned input stimuli to another emulator while continuing emulation, and generating a waveform for debugging.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A system comprising:
    one or more record adaptors configured to record emulation history from one or more emulators of a first emulator platform;
    one or more replay adaptors configured to replay the emulation history on one or more debug stations of a second emulator platform; and
    a record/replay framework coupled to the one or more record adaptors and the one or more replay adaptors, the record/replay framework configured to enable cross platform record-mapping-replay between the one or more emulators of the first emulator platform and the one or more debug stations of the second emulator platform, wherein the one or more record adaptors, the one or more replay adaptors and the record/replay framework are programmed in one or more devices.

2. The system of claim 1 wherein the record/replay framework includes a Hardware Description Language (HDL) parser configured to collect information about state elements, input pins and clocks in a design.

3. The system of claim 2 wherein the HDL parser includes a clock parser configured to collect the information about the clocks.

4. The system of claim 1 further comprising a compiler configured to compile HDL source code.

5. The system of claim 1 wherein the record/replay framework includes a session handler to save a session to be replayed.

6. The system of claim 5 wherein the session handler handles a design snapshot, input stimulus and user actions.

7. The system of claim 1 wherein the record/replay framework includes a record module to perform actions during recording.

8. The system of claim 1 wherein the record/replay framework includes a replay module to perform actions during replay.

9. The system of claim 1 wherein the record/replay framework performs a transformation and an inverse transformation to enable the cross platform record-mapping-replay, performing the transformation includes transforming a clocking scheme and transforming state devices.

10. A system comprising:
    one or more record adaptors configured to record emulation history from one or more emulators of a first emulator platform;
    one or more replay adaptors configured to replay the emulation history on one or more debug stations of a second emulator platform;
    a record/replay framework coupled to the one or more record adaptors and the one or more replay adaptors, the record/replay framework configured to enable cross platform record-mapping-replay between the one or more emulators of the first emulator platform and the one or more debug stations of the second emulator platform, wherein the one or more record adaptors, the one or more replay adaptors and the record/replay framework are programmed in one or more devices, wherein the record/replay framework includes:
        a Hardware Description Language (HDL) parser configured to collect information about state elements, input pins and clocks in a design,
        a session handler to save a session to be replayed,
        a record module to perform actions during recording, and
        a replay module to perform actions during replay; and
    a compiler configured to compile HDL source code.

11. The system of claim 10 wherein the HDL parser includes a clock parser configured to collect the information about the clocks.

12. The system of claim 10 wherein the session handler handles a design snapshot, input stimulus and user actions.

13. A method comprising:
    implementing an emulator/debug station in a plurality of network accessible devices including compiling source code to run on a first emulator platform including performing a transformation during compilation;
    performing testing and/or debugging using the emulator/debug station including recording data; and
    replaying the recorded data on a specific emulator of a second emulator platform by applying an inverse transformation.

14. The method of claim 13 wherein performing the transformation includes transforming a clocking scheme and transforming state devices.

15. The method of claim 13 further comprising mapping design information including input stimuli, flip-flop information and memory states to an original register transfer level space and adjust input stimuli timing based on a clocking scheme of a target machine before applying stimuli for emulation.

16. The method of claim 13 further comprising retrieving clock edge shift information from the first emulator platform and identifying which input signal is associated with which clock domain, wherein the clock edge shift information is utilized to adjust an input signal waveform during record-mapping-replay.

17. The method of claim 13 wherein implementing the emulator/debug station includes mapping of recorded data to generate platform neutral information.

18. The method of claim 13 wherein the emulator/debug station is implemented in a remote server.

19. The method of claim 13 wherein the plurality of network accessible devices comprise at least two different types of machines.

20. The method of claim 13 wherein testing is performed on a different device than debugging.

21. The method of claim 13 further comprising saving and transferring state information between the plurality of devices.

22. The method of claim 13 wherein performing testing and/or debugging using the emulator/debug station is for a specific module, and when a user is working on the specific module, a procedure passes on the hardware description language source code for the specific module.

23. The method of claim 13 wherein performing testing and/or debugging using the emulator/debug station is for a whole design, and when a user is working on the whole design, a procedure passes on all hardware description language source code.

24. The method of claim 13 wherein the emulator/debug station comprises:
    one or more record adaptors each configured to record at least a part of emulation history of a logic design from one or more emulators;
    one or more replay adaptors each configured to replay at least a part of the recorded emulation history; and
    a record/replay framework coupled to the one or more record adaptors and the one or more replay adaptors, the record/replay framework configured to enable cross platform record-mapping-replay.

25. The method of claim 13 wherein the emulator/debug station comprises:
    one or more record adaptors each configured to record at least a part of emulation history of a logic design from one or more emulators;
    one or more replay adaptors each configured to replay at least a part of the recorded emulation history;
    a record/replay framework coupled to the one or more record adaptors and the one or more replay adaptors, the record/replay framework configured to enable cross platform record-mapping-replay, wherein the record/replay framework includes:
        a Hardware Description Language (HDL) parser configured to collect information about state elements, input pins and clocks in a design,
        a session handler to save a session to be replayed,
        a record module to perform actions during recording, and
        a replay module to perform actions during replay; and
    a compiler configured to compile HDL source code.

* * * * *